United States Patent
Zhu et al.

(10) Patent No.: US 12,039,196 B2
(45) Date of Patent: *Jul. 16, 2024

(54) DOUBLE THRESHOLD CONTROLLED SCHEDULING OF MEMORY ACCESS COMMANDS

(71) Applicant: Micron Technology, Inc., Boise, ID (US)

(72) Inventors: Jiangli Zhu, San Jose, CA (US); Wei Wang, Dublin, CA (US); Ying Yu Tai, Mountain View, CA (US); Jason Duong, San Jose, CA (US); Chih-Kuo Kao, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 120 days.

This patent is subject to a terminal disclaimer.

(21) Appl. No.: 17/303,169

(22) Filed: May 21, 2021

(65) Prior Publication Data

US 2021/0271421 A1  Sep. 2, 2021

Related U.S. Application Data

(63) Continuation of application No. 16/289,053, filed on Feb. 28, 2019, now Pat. No. 11,048,437.

(51) Int. Cl.
*G06F 3/06* (2006.01)
*G11C 16/04* (2006.01)

(52) U.S. Cl.
CPC .......... *G06F 3/0659* (2013.01); *G06F 3/0611* (2013.01); *G06F 3/0679* (2013.01); *G11C 16/0483* (2013.01)

(58) Field of Classification Search
CPC .... G06F 3/0659; G06F 3/0611; G06F 3/0679; G11C 16/0483
See application file for complete search history.

(56) References Cited

U.S. PATENT DOCUMENTS

| | | | |
|---|---|---|---|
| 5,822,772 A | 10/1998 | Chan et al. | |
| 5,948,081 A | 9/1999 | Foster | |
| 6,667,926 B1 | 12/2003 | Chen | |
| 7,191,207 B2 * | 3/2007 | Blount | G06F 3/0689 709/200 |

(Continued)

FOREIGN PATENT DOCUMENTS

| | | |
|---|---|---|
| CN | 104137081 A | 11/2014 |
| KR | 10-2014-0042501 A | 4/2014 |

OTHER PUBLICATIONS

International Search Report and Written Opinion for International Application No. PCT/US2020/019720, dated Jun. 25, 2020, 12 pages.

*Primary Examiner* — Kalpit Parikh
(74) *Attorney, Agent, or Firm* — Lowenstein Sandler LLP

(57) ABSTRACT

A processing device in a memory system determines that a number of commands from an active queue that have been executed on a memory device does not satisfy an executed transaction threshold criterion, that a number of pending commands in an inactive queue satisfies a first promotion threshold criterion, and that a number of pending commands in the active queue does not satisfy a second promotion threshold criterion. In response, the processing device switches an execution grant from the active queue to the inactive queue.

20 Claims, 6 Drawing Sheets

(56) References Cited

U.S. PATENT DOCUMENTS

| | | |
|---|---|---|
| 10,114,553 B2 * | 10/2018 | Li .................... G06F 3/0659 |
| 10,296,230 B1 | 5/2019 | Balarishnan et al. |
| 2004/0128428 A1 | 7/2004 | Christenson |
| 2004/0177184 A1 | 9/2004 | Steinman et al. |
| 2006/0248275 A1 | 11/2006 | Blackmon et al. |
| 2014/0223115 A1 * | 8/2014 | Dinkjian ............ G06F 12/00 711/158 |
| 2014/0372696 A1 | 12/2014 | Tune et al. |
| 2018/0232178 A1 | 8/2018 | Iwaki et al. |
| 2019/0196995 A1 * | 6/2019 | Shen .................. G06F 3/0673 |
| 2021/0271610 A1 * | 9/2021 | Shah ................ G06F 12/0897 |

\* cited by examiner

DOUBLE THRESHOLD CONTROLLED SCHEDULING OF MEMORY ACCESS COMMANDS

RELATED APPLICATION

This application is a continuation of U.S. patent application Ser. No. 16/289,053, filed Feb. 28, 2019, which is herein incorporated by reference in its entirety.

TECHNICAL FIELD

Embodiments of the disclosure relate generally to memory sub-systems, and more specifically, relate to double threshold controlled scheduling of memory access commands.

BACKGROUND

A memory sub-system can be a storage system, such as a solid-state drive (SSD), or a hard disk drive (HDD). A memory sub-system can be a memory module, such as a dual in-line memory module (DIMM), a small outline DIMM (SO-DIMM), or a non-volatile dual in-line memory module (NVDIMM). A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
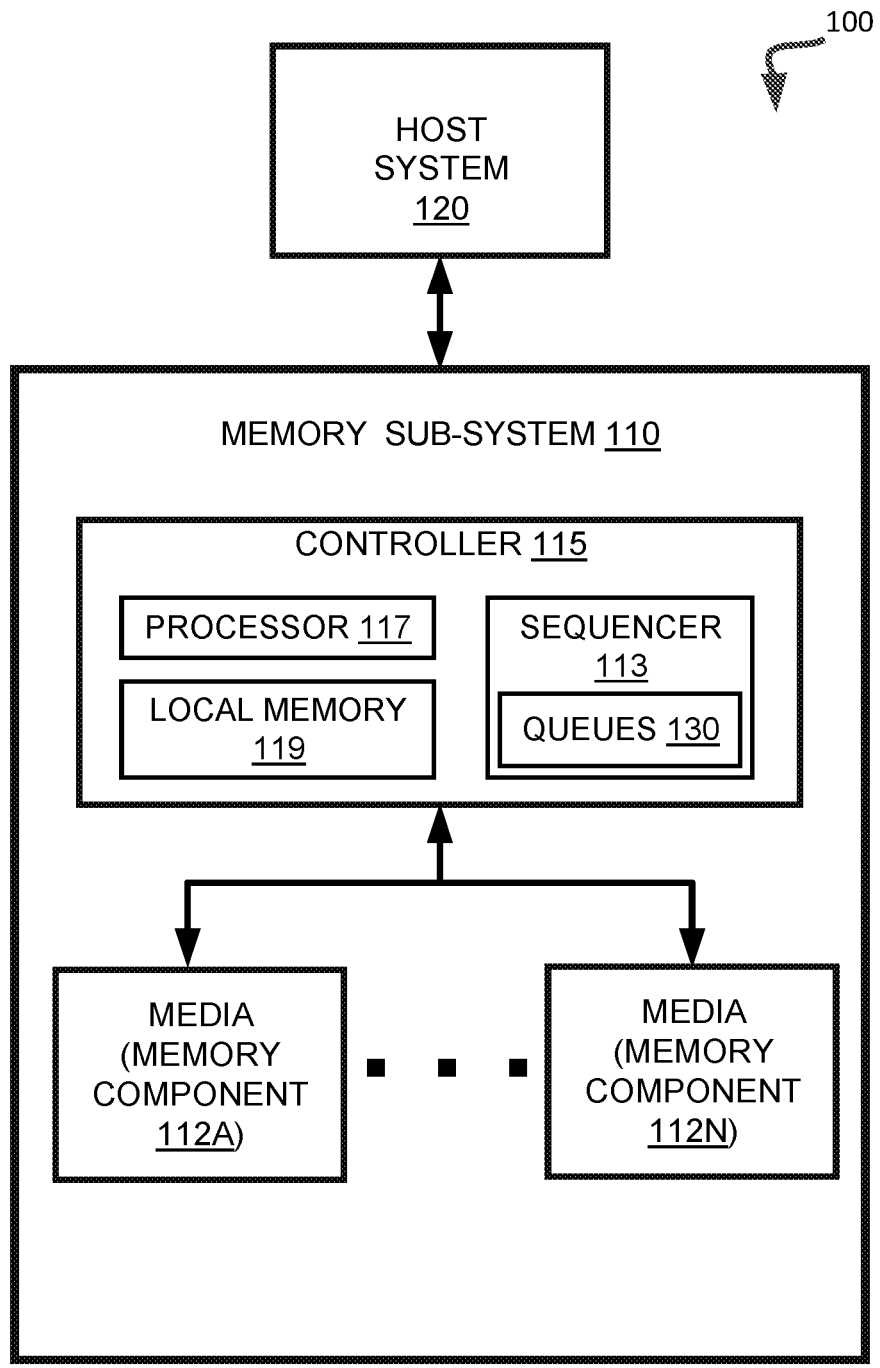
FIG. 1 illustrates an example computing environment that includes a memory sub-system in accordance with some embodiments of the present disclosure.

Aspects of the present disclosure are directed to double threshold controlled scheduling of memory access commands in a memory sub-system. A memory sub-system is also hereinafter referred to as a "memory device." An example of a memory sub-system is a storage device that is coupled to a central processing unit (CPU) via a peripheral interconnect (e.g., an input/output bus, a storage area network). Examples of storage devices include a solid-state drive (SSD), a flash drive, a universal serial bus (USB) flash drive, and a hard disk drive (HDD). Another example of a memory sub-system is a memory module that is coupled to the CPU via a memory bus. Examples of memory modules include a dual in-line memory module (DIMM), a small outline DIMM (SO-DIMM), a non-volatile dual in-line memory module (NVDIMM), etc. In some embodiments, the memory sub-system can be a hybrid memory/storage sub-system. In general, a host system can utilize a memory sub-system that includes one or more memory components. The host system can provide data to be stored at the memory sub-system and can request data to be retrieved from the memory sub-system.

Memory systems generally classify memory commands received from a host system into one of a number of respective categories, such as read commands, write commands, erase commands, etc. The memory commands in each category are assigned to a queue that is specifically dedicated to commands of that particular category. For example, all read commands may be routed to one queue, all write commands may be routed to another queue, etc. Since a command from only one of the queues may be executed at a time, the memory system services the various queues according to a defined scheduling scheme. Popular conventional scheduling schemes include round robin and weighted round robin. In round robin scheduling, the memory system visits each queue in order, executing a single command from that queue on each visit (although empty queues may be skipped). For example if there are two queues, the memory system may execute one command from the first queue, then one command from the second queue, then one command from the first queue again, and so on. With weighted round robin scheduling, the command queues may be allocated some greater amount of bandwidth, such that a group of two or more commands may be executed each time a queue is visited. For example, the memory system may execute five commands from the first queue before switching to the second queue, and then execute five commands from the second queue before switching back to the first queue. As with any system, reducing the latency (i.e., the time that elapses between when a memory command is received and when execution of the memory command is completed) is preferred. As such, the command scheduling scheme is generally selected to achieve the goal of reducing latency.

Depending on certain characteristics of the type of storage media utilized in the memory system, the above described scheduling schemes may provide varying results. Dynamic random access memory (DRAM) devices, for example, have read and write latencies that are approximately equal. As such, execution of any particular read command would take approximately the same amount of time as a write command. With negative-and (NAND) type flash memory, however, the write latency is typically much higher than the read latency. In addition, NAND type flash memory further supports erase operations, which may also have a relatively long associated latency. Accordingly, a different scheduling scheme may be preferred. Furthermore, a cross-point array of non-volatile memory cells has its own special characteristics including asymmetric read and write latency timing (e.g., approximately 100 nanoseconds for reads and approximately 10-20 nanoseconds for writes), which incurs restrictions on utilizing the multi-level parallelism, and thus, make it difficult to optimize the throughput of a cross-point system. A cross-point array of non-volatile memory cells, can have a significantly smaller data unit size than a flash-based memory component, and thus can have a significantly larger number of data units for a memory component of similar capacity. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Thus, such memory components can perform "in-place" data replacement. Since the number of data units in such a memory component is large, a significant amount of computing resources (e.g., processing and memory resources) are used to retrieve, store, and sort various count values associated with the memory component. In addition, retrieving, storing, and sorting the large number of data units takes a proportionately large amount of time, which contributes significantly to latency of the memory sub-system. Accordingly, a different scheduling scheme may be useful to improve performance and reduce latency.

Aspects of the disclosure address the above and other deficiencies by implementing double threshold controlled scheduling of memory access commands in a memory sub-system. In one implementation, the memory sub-system schedules the execution of memory commands from a number of separate queues, such as a read command queue and a write command queue, to a memory component including a cross-point array of non-volatile memory cells, using two separate thresholds ("double thresholds"). In one implementation, the first threshold is defined by a promotion threshold criterion pertaining to a number of pending (i.e., not yet executed) commands in the associated queue. The second threshold is defined by an executed transaction threshold criterion pertaining to a number of commands that have been executed since an execution grant was given to the associated queue. As will be described in more detail herein, in one implementation, both thresholds are used together to determine when to switch the execution grant from one queue to another (i.e., when to stop executing commands from a currently active queue and to start executing commands from an inactive queue, thereby making that queue active).

In one implementation, for a memory sub-system including a read command queue and a write command queue, a sequencer may begin executing requests from whichever of the read command queue or the write command queue has a number of pending commands that satisfy (e.g., exceed) a corresponding promotion threshold criterion. If neither queue satisfies the promotion threshold criterion, the sequencer may continue executing commands from a currently active queue (i.e., the queue from which a command was most recently executed). Each time a command is executed from the active queue, the sequencer may increment a counter indicating the number of commands that have been executed since an execution grant was given to the associated queue. If the sequencer determines that the value of the counter satisfies (e.g., meets or exceeds) a corresponding executed transaction threshold criterion, the sequencer may switch the execution grant from the currently active queue to the inactive queue and reset the value of the counter. While executing commands and incrementing the counter, the sequencer may continue to monitor the number of pending commands in each queue. If at any time prior to the value of the counter satisfying the transaction threshold criterion for the active queue, the number of pending commands in the inactive queue satisfies the corresponding promotion threshold criterion, the sequencer may switch the execution grant to the inactive queue even though the transaction threshold criterion has not yet been satisfied. Upon the execution grant being switched to the other queue, thereby making the inactive queue active, the sequencer may execute commands from that queue and may apply a corresponding promotion threshold criterion and executed transaction threshold criterion to determine when to switch the execution grant again.

Depending on the implementation, the promotion threshold criterion may be the same or different for the various queues and the executed transaction threshold criterion may also be the same or different for the various queues. In some implementations, the promotion threshold criterion and the executed transaction threshold criterion may be configurable to the specific characteristics of the memory sub-system. The use of double threshold controlled scheduling allows the sequencer to optimize that data bus utilization for different types of workloads, thereby reducing the overall latency in the memory-subsystem. When the commands from the host system are balanced between reads and writes, the execution transaction threshold criterion ensures that both queues are serviced in due time. When a read intensive workload is present, however, the promotion threshold criterion ensures that those read commands can be promoted and executed so as to prevent the read command queue from becoming full and subsequent commands from the host being denied. Similarly, the promotion threshold criterion promotes write commands under a write intensive workload. Experimental results show that double threshold controlled scheduling of memory commands can achieve approximately 80% utilization of the data bus between memory controller physical media under a balanced workload compared to only around 60% using conventional scheduling schemes.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EE-PROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data. The data blocks can be further grouped into one or more planes on each of memory components 112A to 112N, where operations can be performed on each of the planes concurrently. Corresponding data blocks from different planes can be associated with one another in a stripe than spans across multiple planes.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a sequencer 113 that can be used to schedule the execution of memory commands received from host system 120 and stored in a multi-level queue structure 130 against one or more of memory components 112A to 112N using two separate thresholds. In one implementation, the first threshold is defined by a promotion threshold criterion pertaining to a number of pending commands in the associated queue. The second threshold is defined by an executed transaction threshold criterion pertaining to a number of commands that have been executed since an execution grant was given to the associated queue. In one implementation, sequencer 113 uses both thresholds together to determine when to switch the execution grant from one queue to another. If sequencer 113 determines that value of the counter indicating the number of transactions that have been executed from a certain queue in queue structure 130 satisfies (e.g., meets or exceeds) a corresponding executed transaction threshold criterion, the sequencer may switch the execution grant from the currently active queue to another inactive queue and reset the value of the counter. While executing commands and incrementing the counter, sequencer 113 may continue to monitor the number of pending commands in each queue. If at any time prior to the value of the counter satisfying the executed transaction threshold criterion for the active queue, the number of pending commands in the inactive queue satisfies the corresponding promotion threshold criterion, sequencer 113 may switch the execution grant to the inactive queue even though the transaction threshold criterion has not yet been satisfied. Upon the execution grant being switched to the other queue, thereby making the inactive queue active, sequencer 113 may execute commands from that queue and may apply a corresponding promotion threshold criterion and executed transaction threshold criterion to determine when to switch the execution grant again. Further details with regards to the operations of sequencer 113 are described below.

Figure 2:
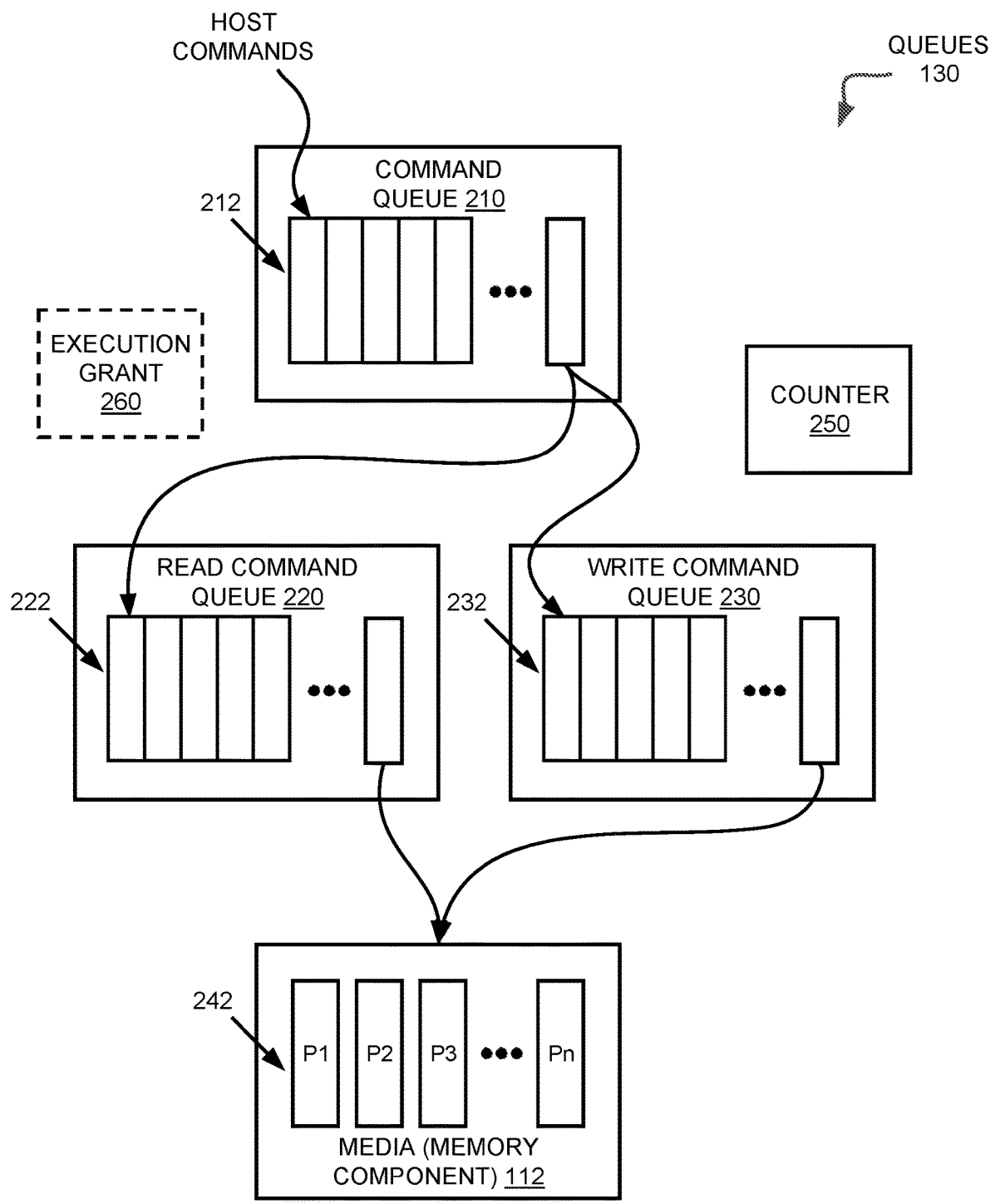
FIG. 2 is a block diagram of multi-level queue structure for processing memory commands using double-threshold controlled scheduling in accordance with some embodiments of the present disclosure.

FIG. 2 is a block diagram of multi-level queue structure 130 for processing memory commands using double-threshold controlled scheduling in accordance with some embodiments of the present disclosure. In one implementation, the multi-level queue structure 130 includes command queue 210, read command queue 220 and write command queue 230. In other implementations, multi-level queue structure 130 may include some other number and/or arrangement of queues. Each of the queues in multi-level queue structure 130 may include a collection of commands that are kept in order, such that the first command enqueued in (i.e., added to) a queue is also the first command to be dequeued (i.e. removed) from the queue. In other implementations, some other data structure or structures may be used, such as a buffer, etc. In one implementation, memory component 112 is a single memory die including a number of separate partitions 242. Memory commands from either read command queue 220 or write command queue 230 can be directed to any of partitions 242. In another implementation, memory component 112 includes multiple memory die. In one implementation, memory sub-system 110 includes a separate multi-level queue structure 130 for each memory component 112 or for each individual memory die of a memory component.

Command queue 210 receives host commands 212 from host system 120, or from some other component of memory sub-system 110, and stores the host commands 212 until further processing can be performed. In one implementation, sequencer 113 identifies a command type of each of the host commands 212 in command queue 210. For example, by examining the structure of a particular host command 212 and looking for an indicative value in a defined command type field, sequencer 113 may determine whether the host command is a read command or a write command. A read command includes instructions to read data from a particular address of a memory component 112, while a write command includes instructions to write data to a particular address of the memory component 112. Depending on the command type, sequencer 113 can move the command to one of read command queue 220 or write command queue 230. Thus, read command queue 220 includes a number of read commands 222 (i.e., a first subset of the host commands 212) and write command queue 230 includes a number of write commands 232 (i.e., a second subset of the host commands 212).

In one implementation, sequencer 113 schedules the execution of memory commands from read command queue 220 and write command queue 230, to memory component 112 using two separate thresholds. In one implementation, the first threshold is defined by a promotion threshold criterion pertaining to a number of pending (i.e., not yet executed) commands in the associated queue. The second threshold is defined by an executed transaction threshold criterion pertaining to a number of commands that have been executed since an execution grant 260 was given to the associated queue. In one implementation, both thresholds are used together to determine when to switch the execution grant from one queue to another (i.e., when to stop executing commands from a currently active queue and to start executing commands from the other queue).

In one implementation, sequencer 113 may begin executing requests from whichever of the read command queue 220 or the write command queue 230 has a number of pending commands that satisfy (e.g., exceed) a corresponding promotion threshold criterion. If neither queue satisfies the promotion threshold criterion, sequencer 113 may continue executing commands from a currently active queue (i.e., the queue from which a command was most recently executed). For purposes of explanation, it can be assumed that read command queue 220 is the currently active queue. Each time a read command 222 is executed from the read command queue 220, sequencer 113 may increment a value of a counter 250 indicating the number of commands that have been executed since the execution grant 260 was given to the associated queue. In one implementation, the execution grant 260 functions as permission to execute commands from the queue with which it is currently associated. For example, execution grant may have one or more corresponding status bits (e.g., using one-hot encoding), the value of which indicates to sequencer 113 which of read command queue 220 and write command queue 230 is currently active. In such an implementation, a first value (e.g., 2'b01) may indicate that write command queue 230 is active, while a second value (e.g., 2'b10) may indicate that read command queue 220 is active. Sequencer 113 can switch the execution grant 260 to another queue (e.g., by modifying the value of the status bits) according to the double threshold controlled scheduling scheme described herein.

If sequencer 113 determines that value of the counter 250 satisfies (e.g., meets or exceeds) a corresponding executed transaction threshold criterion, sequencer 113 may switch the execution grant 260 from the read command queue 220 to the previously inactive write command queue 230 and begin executing the write commands 232. Sequencer 113 may also reset the value of the counter 250. While executing read commands 222 from read command queue 220 and incrementing the counter 250, sequencer 113 may continue to monitor the number of pending commands in each queue. If at any time prior to the value of the counter 250 satisfying the transaction threshold criterion for the read command queue 220, the number of pending write commands 232 in the write command queue 230 satisfies the corresponding promotion threshold criterion, sequencer 113 may switch the execution grant 260 to the write command queue 230 even though the transaction threshold criterion for the read command queue 220 has not yet been satisfied. Thus, responsive to either of the executed transaction threshold criterion for the read command queue 220 being satisfied or the promotion threshold criterion for the write command queue 230 being satisfied, sequencer 113 may switch the execution grant 260 from the read command queue 220 to the write command queue 230. Upon the execution grant 260 being switched to the write command queue 230, sequencer 113 may begin executing write commands 232 against memory component 112.

When write command queue 230 is the currently active queue, each time a write command 232 is executed from the write command queue 230, sequencer 113 may increment a value of counter 250 indicating the number of commands that have been executed since the execution grant 260 was given to the associated queue. In one implementation, the same counter 250 is used for bother read command queue 220 and write command queue 230. In other implementations, each of read command queue 220 and write command queue 230 may have a separate counter.

If sequencer 113 determines that value of the counter 250 satisfies (e.g., meets or exceeds) a corresponding executed transaction threshold criterion, sequencer 113 may switch the execution grant 260 from the write command queue 230 to the read command queue 220 and again execute the read commands 232. Sequencer 113 may also reset the value of the counter 250. While executing write commands 232 from write command queue 230, sequencer 113 may continue to monitor the number of pending commands in each queue. If at any time prior to the value of the counter 250 satisfying the transaction threshold criterion for the write command queue 230, the number of pending read commands 222 in the read command queue 220 satisfies the corresponding promotion threshold criterion, sequencer 113 may switch the execution grant 260 to the read command queue 220 even though the transaction threshold criterion for the write command queue 230 has not yet been satisfied. If, however, the number of pending transactions in the active queue (e.g., write command queue 230) also satisfies the promotion threshold criterion, sequencer 113 may maintain the execution grant 260 with the active queue until the number of executed commands satisfies the executed transaction threshold criterion.

Figure 3:
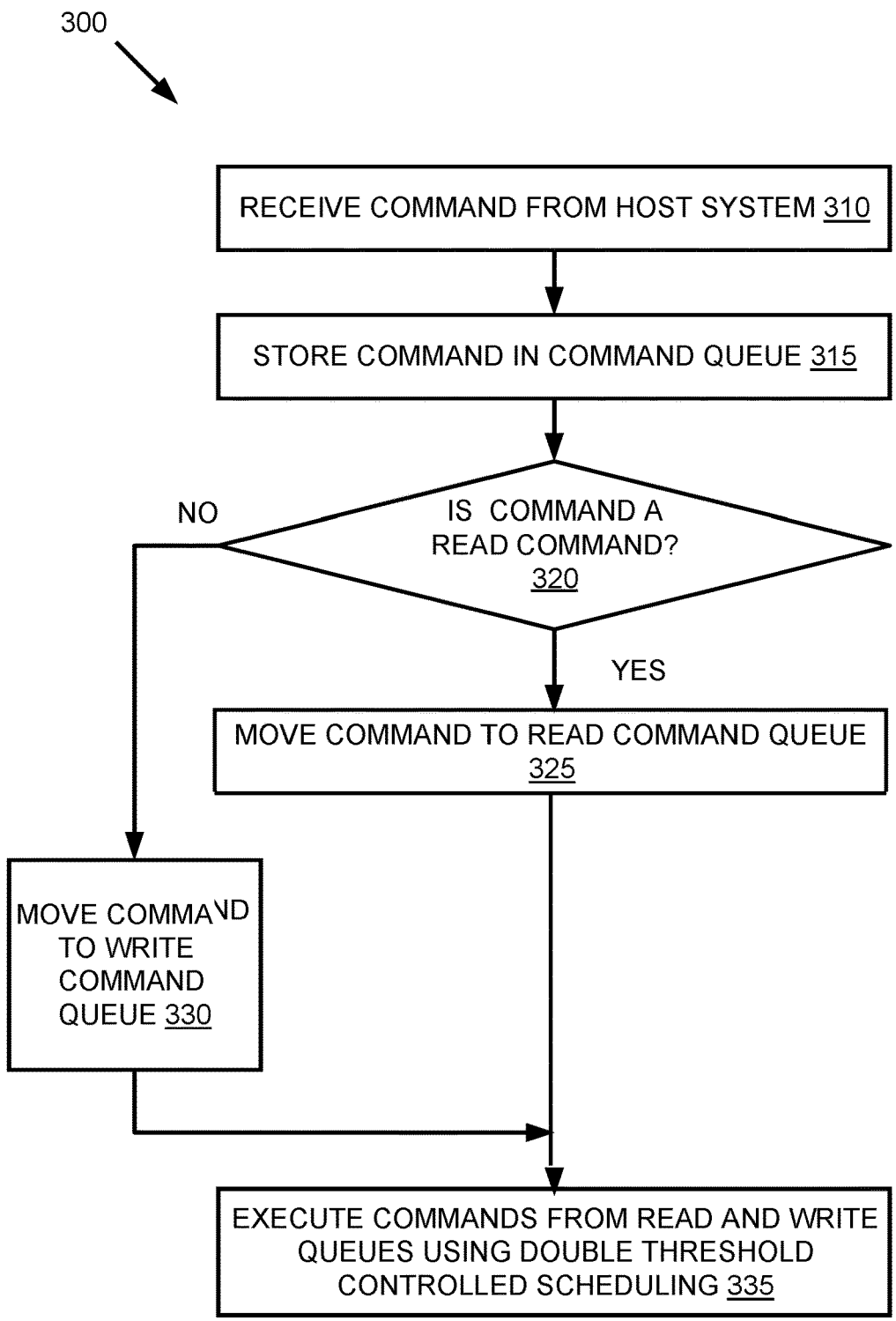
FIG. 3 is a flow diagram of an example method for processing memory commands using double-threshold controlled scheduling in accordance with some embodiments of the present disclosure.

FIG. 3 is a flow diagram of an example method for processing memory commands using double-threshold controlled scheduling in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by sequencer 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing device receives a host command 212 from the host system 120 or from some other component of memory sub-system 110. At operation 315, the processing device stores the host command 212 in command queue 210. Command queue 210 may include a collection of host commands 212 that are kept in order, and implements a first-in-first-out (FIFO) scheme for management of the host commands 212. In other implementations, some other data structure or structures may be used, such as a buffer, etc.

At operation 320, the processing device determines whether the host command 212 is a read command 222. In one implementation, sequencer 113 identifies a command type of each of the host commands 212 in command queue 210. For example, by examining the structure of a particular host command 212 and looking for an indicative value in a defined command type field, sequencer 113 may determine whether the host command is a read command 222 or a write command 232. Depending on the command type, sequencer 113 can move the command to one of read command queue 220 or write command queue 230.

If it is a read command 222, at operation 325, the processing device moves the read command 222 to read command queue 220. If the host command 212 is not a read command and is instead a write command 232, at operation 330, the processing device moves the write command 232 to write command queue 230. Thus, read command queue 220 includes a number of read commands 222 (i.e., a first subset of the host commands 212) and write command queue 230 includes a number of write commands 232 (i.e., a second subset of the host commands 212).

At operation 335, the processing device executes commands from read command queue 220 and write command queue 230 using double threshold controlled scheduling. In one implementation, the first threshold is defined by a promotion threshold criterion pertaining to a number of pending commands in the associated queue. The second threshold is defined by an executed transaction threshold criterion pertaining to a number of commands that have been executed since an execution grant was given to the associated queue. In one implementation, sequencer 113 uses both thresholds together to determine when to switch the execution grant 260 from one queue to another, as will be described in more detail below with respect to FIG. 4 and FIG. 5.

Figure 4:
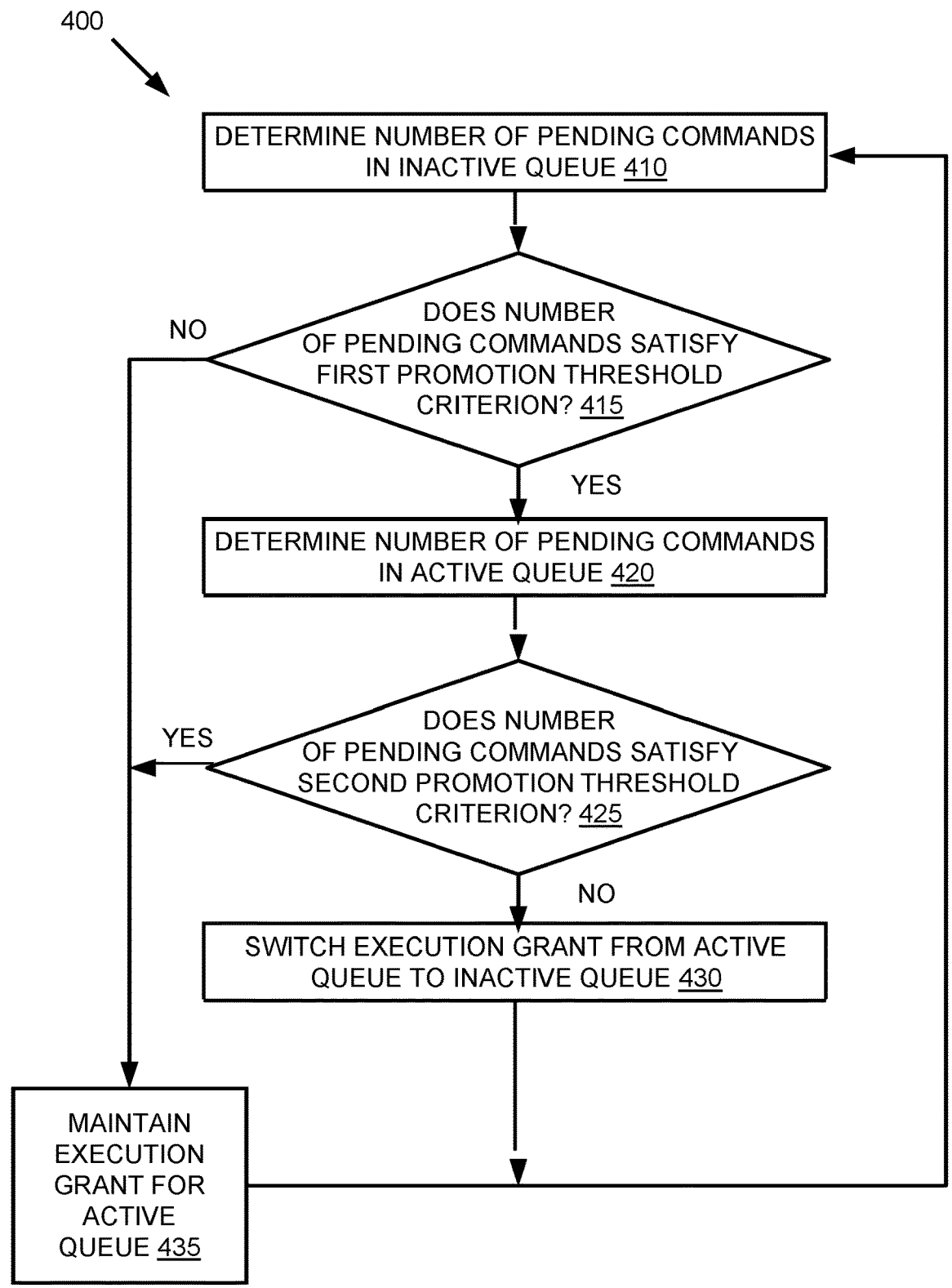
FIG. 4 is a flow diagram of an example method for processing memory commands using a promotional threshold criterion in accordance with some embodiments of the present disclosure.

FIG. 4 is a flow diagram of an example method for processing memory commands using a promotional threshold criterion in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by sequencer 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing device determines a number of pending commands in the inactive one of read command queue 220 and write command queue 230. The active queue may include the queue that currently holds the execution grant 260 and from which commands are currently being executed (or from which a command was most recently executed). Conversely the inactive queue is the other queue that does not currently hold the execution grant 260 and from which commands are not currently being executed (or from which a command was not most recently executed.) In one implementation, sequencer 113 queries the inactive queue to determine how many pending commands are stored in that queue. The number of pending commands may include commands stored in the queue but that have not yet been executed or scheduled for execution for sequencer 113. In another implementation, sequencer 113 maintains a counter (separate from counter 250) for each of read command queue 220 and write command queue 230 that is incremented each time a command is added to the queue and decremented each time a command is executed from the queue. Accordingly, the value of these counters at any point in time will represent the number of pending commands in the corresponding queue.

At operation 415, the processing device determines whether the number of pending commands in the inactive queue satisfies a first promotion threshold criterion associated with the inactive queue. In one implementation, sequencer 113 may continuously or periodically monitor the number of pending commands in both the active and inactive queues. Sequencer 113 may compare the number of pending commands in the inactive queue to the first promotion threshold criterion to determine whether the number of pending commands in the inactive queue satisfies (e.g., meets or exceeds) the corresponding promotion threshold criterion. Depending on the implementation, the first promotion criterion may be expressed as a discreet number of pending commands (e.g., 64 commands) or as a fraction or percentage of the capacity of the inactive queue (e.g., 50% full).

If the first promotion threshold criterion is satisfied, at operation 420, the processing device determines a number of pending commands in the currently active one of read command queue 220 and write command queue 230. In one implementation, sequencer 113 queries the active queue to determine how many pending commands are stored in that queue. In another implementation, sequencer 113 examines a counter associated with the active queue, the value of which represents the number of pending commands in the active queue.

At operation 425, the processing device determines whether the number of pending commands in the active queue satisfies a second promotion threshold criterion associated with the active queue. In one implementation, sequencer 113 may compare the number of pending commands in the active queue to the second promotion threshold criterion to determine whether the number of pending commands in the active queue satisfies (e.g., meets or exceeds) the corresponding promotion threshold criterion. Depending on the implementation, the second promotion threshold criterion associated with the active queue may be either the same as or different than the first promotion threshold criterion associated with the inactive queue.

If the second promotion threshold criterion is not satisfied, at operation 430, the processing device switches the execution grant from the active queue to the inactive queue. Upon the execution grant being switched to the inactive queue, thereby making the inactive queue active, the sequencer may execute commands from that queue and may return to operation 410 and continue to monitor the number of pending commands in each of the active and inactive queues. If either the number of pending commands in the inactive queue does not satisfy the first promotion threshold criterion or the number of pending commands in the active queue does satisfy the second promotion threshold criterion, at operation 435, the processing device maintains the execution grant 260 with the active queue.

Figure 5:
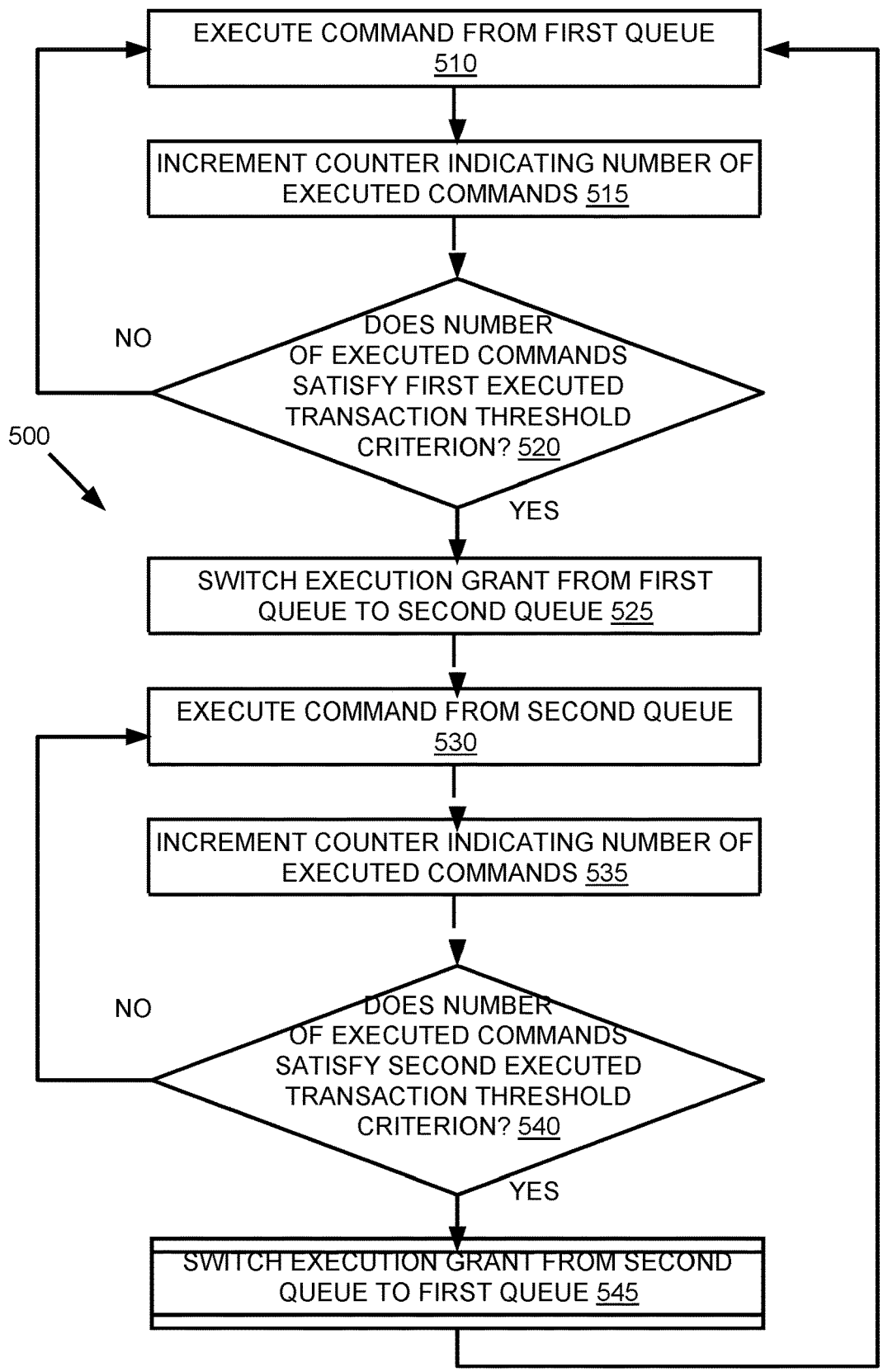
FIG. 5 is a flow diagram of an example method for processing memory commands using an executed transaction threshold criterion in accordance with some embodiments of the present disclosure.

FIG. 5 is a flow diagram of an example method for processing memory commands using an executed transaction threshold criterion in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by sequencer 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing device executes a command from a first queue in multi-level queue structure 130. Sequencer 113 may schedule execution of a memory command from whichever queue currently holds the execution grant 260. If neither queue holds the execution grant 260, sequencer 113 may select a queue for which the number of pending commands satisfies the corresponding promotion threshold criterion, or which has a higher number of pending commands. For example, in one implementation, sequencer 113 may schedule execution of a read command 222 from read command queue 220. At operation 515, the processing device increments a value of counter 250 associated with the read command queue 220, the value indicating a number of read commands 222 that have been executed since read command queue 220 received the execution grant 260.

At operation 520, the processing device determines whether the number of read commands 222 that have been executed (as indicated by the value of counter 250) satisfies a first executed transaction threshold criterion associated with the read command queue 220. In one implementation, sequencer 113 may compare the number of read commands 222 that have been executed to the first executed transaction threshold criterion to determine whether the number of executed commands satisfies (e.g., meets or exceeds) the corresponding executed transaction threshold criterion. Depending on the implementation, the first executed transaction criterion may be expressed as a discreet number of executed commands (e.g., 16 or 32 commands) or as a fraction or percentage of the capacity of the queue (e.g., 20% of the capacity). If the first executed transaction threshold criterion is not satisfied, the processing device returns to operation 510 and executes another read command 222 from read command queue 220.

If the first executed transaction threshold criterion is satisfied, at operation 525, the processing device switches the execution grant 260 from the read command queue 220 to a second queue, such as write command queue 230. At operation 530, the processing device executes a write command 232 from write command queue 230. In one implementation, sequencer 113 selects the oldest write command 232 in write command queue 230. At operation 545, the processing device increments a value of counter 250 associated with the write command queue 230, the value indicating a number of write commands 232 that have been executed since write command queue 230 received the execution grant 260.

At operation 540, the processing device determines whether the number of write commands 232 that have been executed (as indicated by the value of counter 250) satisfies a second executed transaction threshold criterion associated with the write command queue 230. In one implementation, sequencer 113 may compare the number of write commands 232 that have been executed to the second executed transaction threshold criterion to determine whether the number of executed commands satisfies (e.g., meets or exceeds) the corresponding executed transaction threshold criterion. Depending on the implementation, the second executed transaction threshold criterion associated with the write command queue 230 may be either the same as or different than the first executed transaction threshold criterion associated with the read command queue 220. If the second executed transaction threshold criterion is not satisfied, the processing device returns to operation 530 and executes another write command 232 from write command queue 230.

If the second executed transaction threshold criterion is satisfied, at operation 545, the processing device switches the execution grant 260 from the write command queue 230 back to read command queue 220 and returns to block 510 to resume executing the read commands 222 from read command queue 220. As described above, while executing read commands 222 from read command queue 220 or write commands 232 from write command queue 230, sequencer 113 may continue to monitor the number of pending commands in each queue, as described above with respect to FIG. 4. Thus, responsive to either of the executed transaction threshold criterion for the active queue being satisfied or the promotion threshold criterion for the inactive queue being satisfied (unless the promotion threshold criterion for the active queue is also satisfied), sequencer 113 may switch the execution grant 260 from the active queue to the inactive queue.

Figure 6:
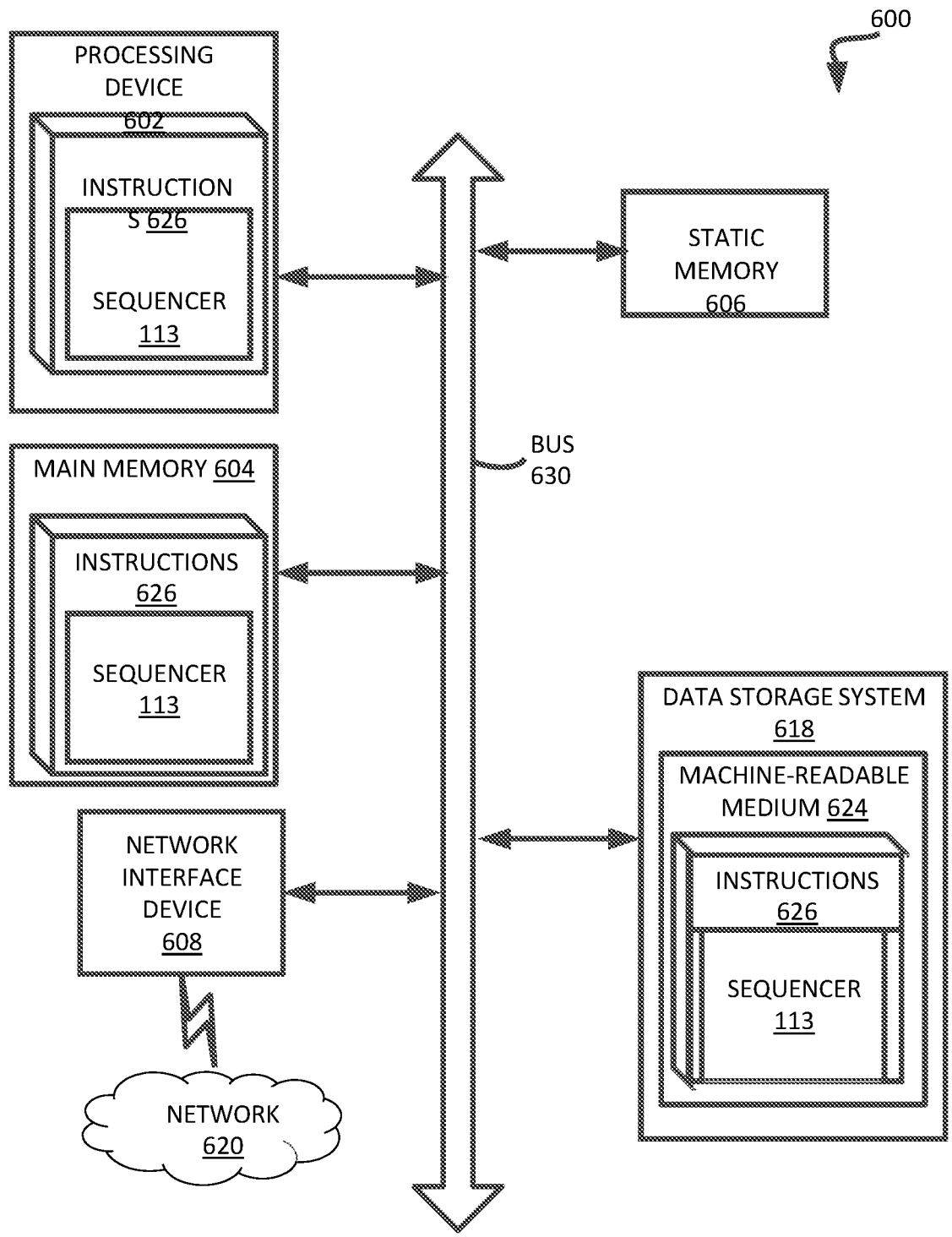
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to sequencer 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to sequencer 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD- ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
    a memory device; and
    a processing device, operatively coupled with the memory device, to perform operations comprising:
        determining (i) that a number of commands from an active queue that have been executed is less than an executed transaction threshold;
        determining (ii) that a number of pending commands in an inactive queue is greater than or equal to a first promotion threshold;
        determining (iii) that a number of pending commands in the active queue is less than a second promotion threshold;
        responsive to determining (i), (ii), and (iii), switching an execution grant from the active queue to the inactive queue to make the inactive queue a previously inactive queue; and
        executing the pending commands from the previously inactive queue.

2. The system of claim 1, wherein the memory device comprises a cross-point array of non-volatile memory cells.

3. The system of claim 1, wherein the processing device is to perform operations further comprising:
    executing one or more of a first plurality of memory commands stored in the active queue; and
    incrementing a value of a counter associated with the active queue in response to executing each of the one or more of the first plurality of memory commands.

4. The system of claim 3, wherein determining that the number of commands from the active queue that have been executed is less than the executed transaction threshold comprises comparing the value of the counter associated with the active queue to the executed transaction threshold.

5. The system of claim 3, wherein switching the execution grant from the active queue to the inactive queue comprises:
    pausing execution of the one or more of the first plurality of memory commands from the active queue; and
    executing one or more of a second plurality of memory commands stored in the inactive queue.

6. The system of claim 1, wherein one of the active queue or the inactive queue stores read commands and wherein an other of the active queue or the inactive queue stores write commands.

7. The system of claim 1, wherein the processing device is to perform operations further comprising:
    determining that the number of commands from the active queue that have been executed has increased from a first value that is less than the executed transaction threshold, to a second value that is greater than or equal to the executed transaction threshold; and
    switching the execution grant from the active queue to the inactive queue.

8. A method comprising:
    determining (i) that a number of commands from an active queue that have been executed is less than an executed transaction threshold;
    determining (ii) that a number of pending commands in an inactive queue is greater than or equal to a first promotion threshold;
    determining (iii) that a number of pending commands in the active queue is less than a second promotion threshold;
    responsive to determining (i), (ii), and (iii), switching an execution grant from the active queue to the inactive queue to make the inactive queue a previously inactive queue; and
    executing the pending commands from the previously inactive queue.

9. The method of claim 8, further comprising:
    executing one or more of a first plurality of memory commands stored in the active queue; and
    incrementing a value of a counter associated with the active queue in response to executing each of the one or more of the first plurality of memory commands.

10. The method of claim 9, wherein determining that the number of commands from the active queue that have been executed is less than the executed transaction threshold comprises comparing the value of the counter associated with the active queue to the executed transaction threshold.

11. The method of claim 9, wherein switching the execution grant from the active queue to the inactive queue comprises:
    pausing execution of the one or more of the first plurality of memory commands from the active queue; and
    executing one or more of a second plurality of memory commands stored in the inactive queue.

12. The method of claim 8, wherein one of the active queue or the inactive queue stores read commands and wherein an other of the active queue or the inactive queue stores write commands.

13. The method of claim 8, wherein the processing device is to perform operations further comprising:
    determining that the number of commands from the active queue that have been executed has increased from a first value that is less than the executed transaction threshold, to a second value that is greater than or equal to the executed transaction threshold; and switching the execution grant from the active queue to the inactive queue.

14. A non-transitory computer-readable storage medium comprising instructions that, when executed by a processing device, cause the processing device to perform operations comprising:

determining (i) that a number of commands from an active queue that have been executed on a memory device is less than an executed transaction threshold;

determining (ii) that a number of pending commands in an inactive queue is greater than or equal to a first promotion threshold;

determining (iii) that a number of pending commands in the active queue is less than a second promotion threshold;

responsive to determining (i), (ii), and (iii), switching an execution grant from the active queue to the inactive queue to make the inactive queue a previously inactive queue; and executing the pending commands from the previously inactive queue.

15. The non-transitory computer-readable storage medium of claim 14, wherein the memory device comprises a cross-point array of non-volatile memory cells.

16. The non-transitory computer-readable storage medium of claim 14, wherein the instructions cause the processing device to perform operations further comprising:

executing one or more of a first plurality of memory commands stored in the active queue; and incrementing a value of a counter associated with the active queue in response to executing each of the one or more of the first plurality of memory commands.

17. The non-transitory computer-readable storage medium of claim 16, wherein determining that the number of commands from the active queue that have been executed is less than the executed transaction threshold comprises comparing the value of the counter associated with the active queue to the executed transaction threshold.

18. The non-transitory computer-readable storage medium of claim 16, wherein switching the execution grant from the active queue to the inactive queue comprises:

pausing execution of the one or more of the first plurality of memory commands from the active queue; and executing one or more of a second plurality of memory commands stored in the inactive queue.

19. The non-transitory computer-readable storage medium of claim 14, wherein one of the active queue or the inactive queue stores read commands and wherein an other of the active queue or the inactive queue stores write commands.

20. The non-transitory computer-readable storage medium of claim 14, wherein the instructions cause the processing device to perform operations further comprising:

determining that the number of commands from the active queue that have been executed has increased from a first value that is less than the executed transaction threshold, to a second value that is greater than or equal to the executed transaction threshold; and switching the execution grant from the active queue to the inactive queue.

\* \* \* \* \*